(12) United States Patent
Nakada et al.

(10) Patent No.: US 10,006,119 B2
(45) Date of Patent: *Jun. 26, 2018

(54) HIGH-TEMPERATURE PROCESSING FURNACE AND REINFORCEMENT FIBER JOINING METHOD

(71) Applicant: IHI Corporation, Koto-ku (JP)

(72) Inventors: Yukihiro Nakada, Tokyo (JP); Kenichiro Watanabe, Tokyo (JP); Hiroshige Murata, Tokyo (JP)

(73) Assignee: IHI Corporation, Koto-ku (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/224,174

(22) Filed: Jul. 29, 2016

(65) Prior Publication Data

US 2016/0333466 A1 Nov. 17, 2016

Related U.S. Application Data

(60) Division of application No. 14/684,989, filed on Apr. 13, 2015, now Pat. No. 9,695,504, which is a
(Continued)

(30) Foreign Application Priority Data

Oct. 15, 2012 (JP) ................................. 2012-227632

(51) Int. Cl.
*C23C 14/56* (2006.01)
*C23C 16/54* (2006.01)
(Continued)

(52) U.S. Cl.
CPC ........... *C23C 14/562* (2013.01); *B65H 51/28* (2013.01); *B65H 69/04* (2013.01); *C23C 16/545* (2013.01); *F27B 9/28* (2013.01)

(58) Field of Classification Search
None
See application file for complete search history.

(56) References Cited

U.S. PATENT DOCUMENTS 4,343,836 A 8/1982 Newkirk et al.
6,273,955 B1 8/2001 Yoshino et al.
(Continued)

FOREIGN PATENT DOCUMENTS

GB 2 057 018 A 3/1981
JP 56-049040 A 5/1981
(Continued)

OTHER PUBLICATIONS

Extended European Search Report dated Dec. 21, 2016 in Patent Application No. 13847490.3.
(Continued)

*Primary Examiner* — Joseph A Miller, Jr.
(74) *Attorney, Agent, or Firm* — Oblon, McClelland, Maier & Neustadt, L.L.P.

(57) ABSTRACT

Arranged in the middle of an upper communication sleeve 21 is a first shutter 25 that is moved back and forth in a horizontal open-close direction to open and close a first communication path 23 that makes the inside of a first bobbin chamber 11 and the inside of a furnace body 3 communicate with each other. Arranged in a middle of a lower communication sleeve 53 is a second shutter 57 that is moved back and forth in a horizontal open-close direction to open and close a second communication path 55 that makes a second bobbin chamber 33 and the inside of the furnace body 3 communicate with each other.

3 Claims, 3 Drawing Sheets

Related U.S. Application Data continuation of application No. PCT/JP2013/076498, filed on Sep. 30, 2013.

(51) Int. Cl.
*F27B 9/28* (2006.01)
*B65H 69/04* (2006.01)
*B65H 51/28* (2006.01)

(56) References Cited

U.S. PATENT DOCUMENTS

| | | | |
|---|---|---|---|
| 6,338,872 B1 | 1/2002 | Yoshino et al. | |
| 2010/0230040 A1 | 9/2010 | Tashiro et al. | |

FOREIGN PATENT DOCUMENTS

| | | | |
|---|---|---|---|
| JP | S59-084586 A | 5/1984 |
| JP | H5-251361 A | 9/1993 |
| JP | H6-172033 A | 6/1994 |
| JP | H07-197264 A | 8/1995 |
| JP | H9-195055 A | 7/1997 |
| JP | 3122216 B2 | 10/2000 |
| JP | 2003-144900 A | 5/2003 |
| JP | 2011-94244 A | 5/2011 |
| JP | 2011-157632 A | 8/2011 |
| JP | 2012-131874 A | 7/2012 |
| WO | 2009/044641 A1 | 4/2009 |

OTHER PUBLICATIONS

International Search Report dated Dec. 24, 2013 for PCT/JP2013/076498 filed on Sep. 30, 2013 with English Translation.

Written Opinion dated Dec. 24, 2013 for PCT/JP2013/076498 filed on Sep. 30, 2013.

Combined Chinese Office Action and Search Report dated Mar. 17, 2016 in Patent Application No. 201380053354.6 (with English translation of Categories of Cited Documents).

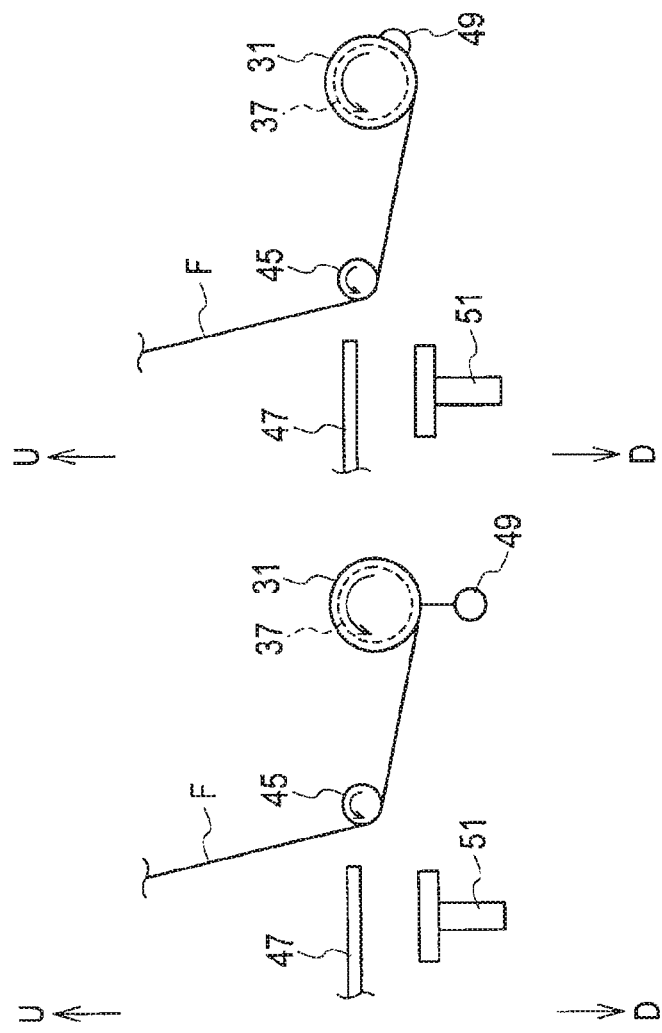

HIGH-TEMPERATURE PROCESSING FURNACE AND REINFORCEMENT FIBER JOINING METHOD

CROSS REFERENCE TO RELATED APPLICATION

This application is a division of U.S. application Ser. No. 14/684,989 filed Apr. 13, 2015, which is a Continuation of PCT Application No. PCT/JP2013/76498 filed Sep. 30, 2013, and claims the benefit of priority under 35 U.S.C. 119(a) to Japanese Patent Application No. 2012-227632 filed Oct. 15, 2012, the entire contents of each of which are incorporated herein.

TECHNICAL FIELD

The present invention relates to a high-temperature processing furnace to carry out a high-temperature process such as a CVD process on a reinforcement fiber in a vacuum atmosphere and to a reinforcement fiber joining method to join a reinforcement fiber wound around a feed bobbin to a guide cord attached to an empty take-up bobbin.

BACKGROUND ART

The configuration and the like of a general high-temperature processing furnace that carries out a high-temperature process on a reinforcement fiber in a vacuum atmosphere will be explained.

The general high-temperature processing furnace has a furnace body. The furnace body is able to be internally vacuumed (decompressed) and the internal temperature thereof is adjustable (able to be increased or decreased). On one widthwise side of the furnace body, a first bobbin chamber is arranged to set (accommodate) therein a feed bobbin around which a reinforcement fiber is wound. The inside of the first bobbin chamber communicates with the inside of the furnace body, and similar to the furnace body, is able to be internally vacuumed. Arranged inside the first bobbin chamber is a first bobbin support member to detachably support the feed bobbin so that the feed bobbin may rotate around an axial center (of the feed bobbin).

On the other widthwise side of the furnace body, a second bobbin chamber is arranged to set (accommodate) therein a take-up bobbin that takes up the reinforcement fiber after a high-temperature process is carried out on the reinforcement fiber. The inside of the second bobbin chamber communicates with the inside of the furnace body, and similar to the furnace body, is able to be internally vacuumed. Arranged inside the second bobbin chamber is a second bobbin support member to detachably support the take-up bobbin so that the take-up bobbin may rotate around an axial center (of the take-up bobbin).

Operation of the high-temperature processing furnace with the configuration mentioned above will be explained.

The inside of the furnace body, the inside of the first bobbin chamber, and the inside of the second bobbin chamber are vacuumed and the internal temperature of the furnace body is increased to a predetermined processing temperature and is kept thereat. The feed bobbin and take-up bobbin are rotated around their respective axial centers in synchronization with each other. As a result, the reinforcement fiber is fed from the feed bobbin into the furnace body, is high-temperature-processed in a vacuum atmosphere, and is taken up by the take-up bobbin.

If the feed bobbin becomes empty during the high temperature process of the reinforcement fiber, a reinforcement fiber joining operation (connecting operation) is carried out as mentioned below.

The internal temperature of the furnace body is decreased to an external temperature (atmospheric temperature). The inside of the furnace body, the inside of the first bobbin chamber, and the inside of the second bobbin chamber are opened to the atmosphere. The emptied feed bobbin is detached from the first bobbin support member and a feed bobbin around which a reinforcement fiber is wound is attached to the first bobbin support member. Namely, the feed bobbin with the reinforcement fiber is set in the first bobbin chamber. The take-up bobbin that has taken up the high-temperature-processed reinforcement fiber is detached from the second bobbin support member and an empty take-up bobbin is attached to the second bobbin support member. Namely, the empty take-up bobbin is set in the second bobbin chamber. A front end of the reinforcement fiber wound around the feed bobbin is attached to the empty take-up bobbin, to join (connect) the feed bobbin and take-up bobbin to each other. The inside of the furnace body, the inside of the first bobbin chamber, and the inside of the second bobbin chamber are vacuumed. The internal temperature of the furnace body is increased to the predetermined processing temperature and is kept thereat. Then, the high-temperature process of the reinforcement fiber is able to be resumed.

Related arts concerning the present invention include Japanese Unexamined Patent Application Publication No. H07-197264 (Patent Literature 1) and Japanese Unexamined Patent Application Publication No. 2011-157632 (Patent Literature 2).

SUMMARY OF INVENTION

Problems to be Solved by Invention

As mentioned above, the joining operation of a reinforcement fiber is carried out by setting a feed bobbin around which the reinforcement fiber is wound in the first bobbin chamber and an empty take-up bobbin in the second bobbin chamber. For this, it is necessary to decrease the internal temperature of the furnace body, vacuum the inside of the furnace body and the like, and increase the internal temperature of the furnace body. This results in elongating a time needed for the reinforcement fiber joining operation, i.e., a time until the high-temperature process of the reinforcement, fiber is resumed, thereby hardly increasing the productivity of the high-temperature process of the reinforcement fiber.

The present invention is able to provide a high-temperature processing furnace and the like capable of greatly shortening a time up to the resumption of the high-temperature process of a reinforcement fiber and improving the productivity of the high-temperature process of a reinforcement fiber.

Means to Solve Problems

According to a first aspect of the present invention, there is provided a high-temperature processing furnace for carrying out a high-temperature process on a reinforcement fiber in a vacuum atmosphere, characterized in that the furnace includes a furnace body that is able to be internally vacuumed (decompressed to a vacuum) and is adjustable (able to be increased or decreased) in its internal temperature, a first bobbin chamber that arranged on one heightwise side (upper or lower side) of the furnace body, is able to be internally vacuumed, and sets (accommodates) therein a feed bobbin around which the reinforcement fiber is wound, a first bobbin support member that is set in the first bobbin chamber and detachably and rotatably supports the feed bobbin so that the feed bobbin is rotatable around its axial center (the axial center of the feed bobbin), a first shutter that opens and closes a first communication path (first opening) to connect the inside of the first bobbin chamber and the inside of the furnace body to each other, a second bobbin chamber that is arranged on the other heightwise side (lower or upper side) of the furnace body, is able to be internally vacuumed, and sets (accommodates) therein a take-up bobbin to take up the reinforcement fiber after the high-temperature process, a second bobbin support member that is set in the second bobbin chamber and detachably and rotatably supports the take-up bobbin so that the take-up bobbin is rotatable around its axial center (the axial center of the take-up bobbin), and a second shutter that opens and closes a second communication path (second opening) to connect the inside of the second bobbin chamber and the inside of the furnace body to each other.

In the specification and claims of this patent application, the wording "arranged" means that an object is directly arranged on something, or is indirectly arranged on something through another object and "set" means that an object is directly set on something, or is indirectly set on something through another object. The wording "reinforcement fiber" means a carbon fiber, a ceramics fiber used as a component of a ceramics-based composite material, or the like. The wording "high-temperature process" means a PVD process, CVD process, or the like.

Operation of the high-temperature furnace according to the first aspect will be explained.

The first shutter is driven to open the first communication path so that the inside of the first bobbin chamber and the inside of the furnace body communicate with each other. At the same time, the second shutter is driven to open the second communication path so that the inside of the second bobbin chamber and the inside of the furnace body communicate with each other. The inside of the furnace body, the inside of the first bobbin chamber, and the inside of the second bobbin chamber are vacuumed. The internal temperature of the furnace body is increased to a predetermined processing temperature and is kept thereat. The feed bobbin and take-up bobbin are rotated around their respective axial centers in synchronization with each other. As a result, the reinforcement fiber is fed from the feed bobbin into the furnace body, is processed in a vacuum atmosphere at the high temperature, and is taken up by the take-up bobbin.

If the feed bobbin becomes empty during the high-temperature process of the reinforcement fiber, a reinforcement fiber joining process (connecting process) is carried out as mentioned below.

The first shutter is driven to close the first communication path so that the inside of the first bobbin chamber and the inside of the furnace body are blocked from each other. The inside of the first bobbin chamber is opened to the atmosphere. The emptied feed bobbin detached from the first bobbin support member and a feed bobbin around which a reinforcement, fiber is wound is attached to the first bobbin support member, thereby setting the reinforcement-fiber-wound feed bobbin in the first bobbin chamber. The inside of the first bobbin chamber is vacuumed. The first shutter is driven to open the first communication path so that the inside of the first bobbin chamber and the inside of the furnace body communicate with each other.

Similarly, the second shutter is driven to close the second communication path so that the inside of the second bobbin chamber and the inside of the furnace body are blocked from each other. The inside of the second bobbin chamber is opened to the atmosphere. The take-up bobbin around which the high-temperature-processed reinforcement fiber is wound is detached from the second bobbin support member and an empty take-up bobbin is attached to the second bobbin support member, thereby setting the empty take-up bobbin in the second bobbin chamber. The inside of the second bobbin chamber is vacuumed. The second shutter is driven to open the second communication path so that the inside of the second bobbin chamber and the inside of the furnace body communicate with each other.

After the inside of the first bobbin chamber and the inside of the furnace body are made to communicate with each other and the inside of the second bobbin chamber and the inside of the furnace body are made to communicate with each (connected) to each other through the reinforcement fiber. Then, the high-temperature process of the reinforcement fiber is resumed.

In this way, the high-temperature processing furnace includes the first shutter to open and close the first communication path and the second shutter to open and close the second communication path. This configuration allows, during the reinforcement fiber joining process, not to carry out the steps of decreasing the internal temperature of the furnace body, vacuuming the inside of the furnace body, and increasing the internal temperature of the furnace body when setting a reinforcement-fiber-wound feed bobbin in the first bobbin chamber and an empty take-up bobbin in the second bobbin chamber.

According to a second aspect of the present invention, the high-temperature processing furnace of the first aspect further includes a support member that is arranged in the second bobbin chamber and supports a loop formed at a front end of a guide cord (guide string member) attached to the take-up bobbin, wherein the loop is shrinkable with tension acting on the guide cord.

According to a third aspect of the present invention, there is provided a reinforcement fiber joining method (reinforcement, fiber connecting method) that employs the high-temperature processing furnace of the second aspect, and in the high-temperature process of a reinforcement fiber carried out in a vacuum atmosphere, joins (connects) a reinforcement fiber wound around a feed bobbin to a guide cord attached to an empty take-up bobbin. The method includes a feed bobbin setting process of driving the first shutter to close the first communication path so that the inside of the first bobbin chamber and the inside of the furnace body are blocked from each other, opening the inside of the first bobbin chamber to the atmosphere, detaching an emptied feed bobbin from the first bobbin support member, and attaching the feed bobbin around which the reinforcement fiber is wound to the first bobbin support member, thereby setting the reinforcement-fiber-wound feed bobbin in the first bobbin chamber, a first bobbin chamber connecting process of, after the completion of the feed bobbin setting process, vacuuming the inside of the first bobbin chamber and driving the first shutter to open the first communication path so that the inside of the first bobbin chamber and the inside of the furnace body communicate with each other, a take-up bobbin setting process of driving the second shutter to close the second communication path so that the inside of the second bobbin chamber and the inside of the furnace body are blocked from each other, opening the inside of the second bobbin chamber to the atmosphere, detaching a take-up bobbin around which a high-temperature-processed reinforcement fiber is wound from the second bobbin support member, supporting a loop of the guide cord on the support member, and attaching the empty take-up bobbin to the second bobbin support member, thereby setting the empty take-up bobbin in the second bobbin chamber, a second bobbin chamber connecting process of, after the completion of the take-up bobbin setting process, vacuuming the inside of the second bobbin chamber and driving the second shutter to open the second communication path so that the inside of the second bobbin chamber and the inside of the furnace body communicate with each other, a weight passing process of, after the completion of the first bobbin chamber connecting process and second bobbin chamber connecting process, rotating the feed bobbin around its axial center, so that a weight attached to a front end of the reinforcement, fiber is fed into the second bobbin chamber through the inside of the furnace body and is passed through the loop of the guide cord, and a loop joining process of, after the completion of the weight passing process, turning the take-up bobbin around its axial center to draw the weight toward the take-up bobbin and shrink the loop of the guide cord, thereby joining the loop and the front end of the reinforcement fiber together.

According to the third aspect, the inside of the first bobbin chamber and the inside of the furnace body are made to communicate with each other and the inside of the second bobbin chamber and the inside of the furnace body are made to communicate with each other. Thereafter, the weight is passed through the loop of the guide cord, and in this state, the loop of the guide cord is shrunken and is joined with the front end of the reinforcement fiber. With this, the reinforcement fiber and the loop of the guide cord are automatically joined together. In other words, the feed bobbin and the take-up bobbin are automatically connected to each other through the reinforcement fiber.

BRIEF DESCRIPTION OF DRAWINGS

FIGS. 3A and 3B are views illustrating models for explaining the reinforcement fiber joining method according to the embodiment of the present invention and FIG. 3C is a view illustrating a model of a take-up bobbin around which a high-temperature-processed reinforcement fiber is wound.

MODE OF IMPLEMENTING INVENTION

Figure 1:
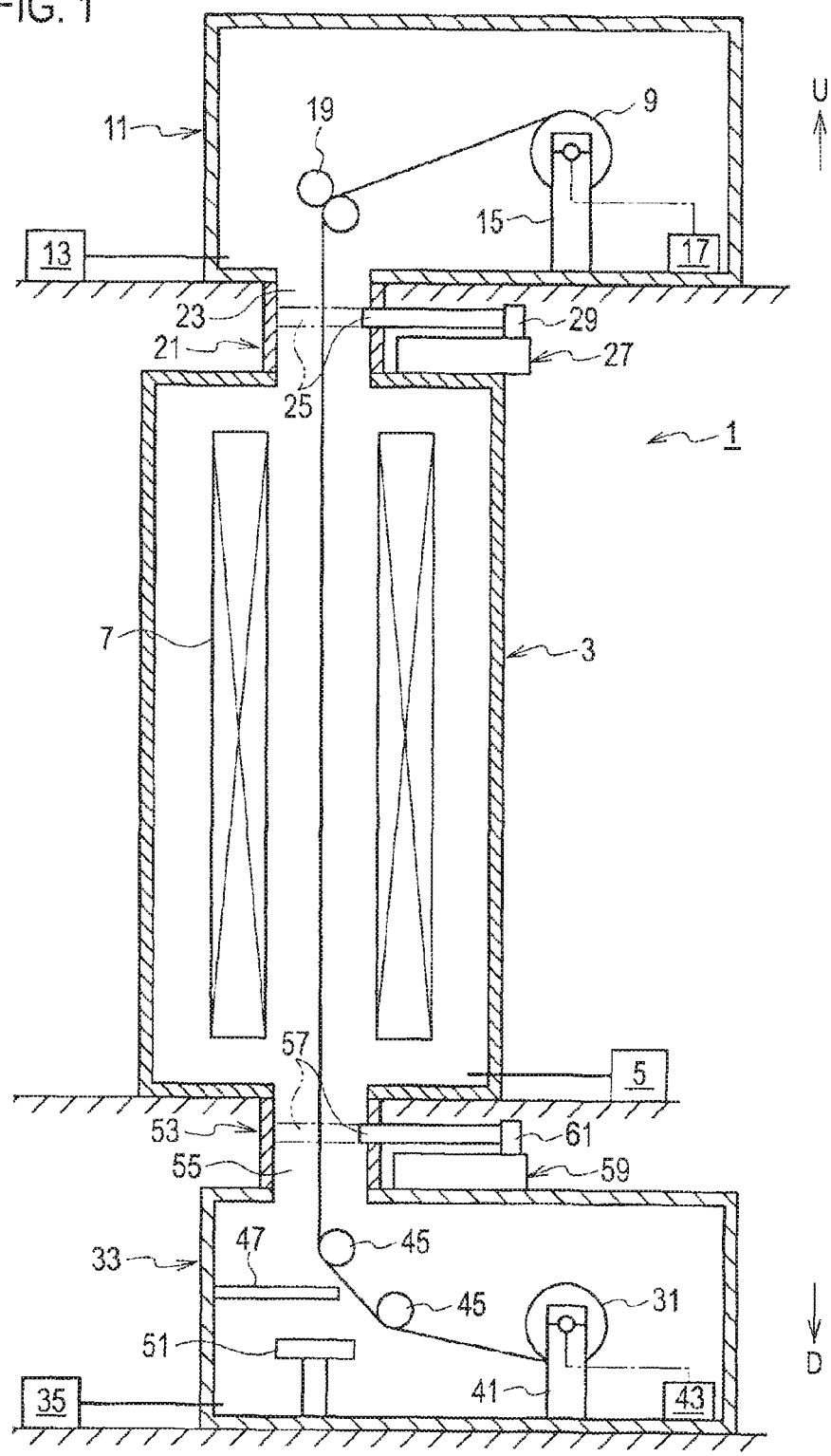
FIG. 1 is a view illustrating a model of a high-temperature processing furnace according to an embodiment of the present invention.

Embodiments of the present invention will be explained with reference to the drawings. In the drawings, indicates an up direction and "D" indicates a down direction.

As illustrated in FIG. 1, a high-temperature processing furnace 1 according to an embodiment of the present invention is an apparatus that carries out a high-temperature process such as a. PVD process, a CVD process, or the like on a reinforcement fiber (a reinforcement fiber bundle) F in a vacuum atmosphere. The high-temperature processing furnace 1 according to the embodiment of the present invention will be explained in detail.

The high-temperature processing furnace 1 has a cylindrical furnace body 3 extending in an up-down direction. On a side wall of the furnace body 3, a door (not illustrated) that is opened and closed is arranged. The furnace body 3 is connected to a vacuum generator 5 such as a vacuum pump to establish a vacuum state. The inside of the furnace body 3 has a closed structure to be vacuumed (decompressed). In the furnace body 3, cylindrical radiant heater 7 is arranged so that the internal temperature of the furnace body 3 is adjustable (able to be increased or decreased).

On an upper side (one heightwise side) of the furnace body 3, a first bobbin chamber 11 is arranged to set (accommodate) therein a feed bobbin 9 around which the reinforcement fiber F is wound. The first bobbin chamber 11 is connected to a vacuum generator 13 such as a vacuum pump to generate a vacuum pressure. The inside of the first bobbin chamber 11 has a closed structure to be vacuumed. On a side wall of the first bobbin chamber 11, a door (not illustrated) that is opened and closed is arranged.

In the first bobbin chamber 11, a first bobbin support member 15 is arranged. The first bobbin support member 15 detachably and rotatably supports the feed bobbin 9 so that the feed bobbin 9 may rotate around an axial center (of the feed bobbin 9). At a proper position in the first bobbin chamber 11, a first motor 17 is arranged to turn the feed bobbin 9 around the axial center thereof. Also in the first bobbin chamber 11, an upper guide roller pair 19 is rotatably arranged to hold the reinforcement fiber F and guide the same toward the furnace body 3.

Between the furnace body 3 and the first bobbin chamber 11, an upper communication sleeve 21 is arranged to communicate with them. An upper end of the upper communication sleeve 21 communicates with the inside of the first bobbin chamber 11 and a lower end of the upper communication sleeve 21 communicates with the inside of the furnace body 3. Namely, the upper communication sleeve 21 internally has a first communication path 23 to connect the inside of the first bobbin chamber 11 and the inside of the furnace body 3 to each other. A cross-sectional part of the first communication path 23 is a first opening to connect the inside of the first bobbin chamber 11 and the inside of the furnace body 3 to each other.

In the middle of the upper communication sleeve 21 (between the furnace body 3 and the first bobbin chamber 11), a first shutter 25 is arranged to open and close the first communication path 23. The first shutter 25 is movable back and forth in a horizontal open-close direction with the help of a first guide member (not illustrated). On the upper side of the furnace body 3, a first rodless cylinder 27 is arranged to move the first shutter 25 in the horizontal open-close direction. The first rodless cylinder 27 has a first needle 29 that is connected to the first shutter 25 and is movable in the horizontal open-close direction. The first shutter 25 is not limited to the one that moves back and forth in the horizontal open-close direction. It may be one that turns (swings) in the horizontal open-close direction.

On a lower side (the other heightwise side) of the furnace body 3, a second bobbin chamber 33 is arranged to set (accommodate) therein a take-up bobbin 31 to take up the reinforcement fiber F after the fiber is high-temperature-processed. The second bobbin chamber 33 is connected to a vacuum generator 35 such as a vacuum pump to generate a vacuum condition. The inside of the second bobbin chamber 33 has a closed structure to be vacuumed. On a side wall of the second bobbin chamber 33, a door (not illustrated) that is opened and closed is arranged.

Figure 2A:
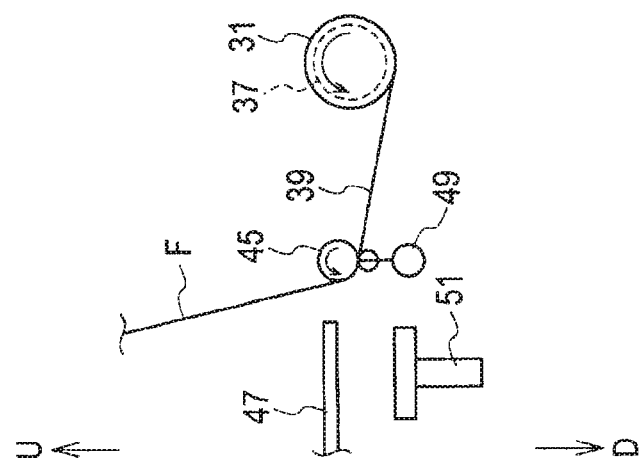
FIGS. 2A, 2B, and 2C are views illustrating models for explaining a reinforcement fiber joining method according to the present embodiment of the present invention.

As illustrated in FIGS. 2A and 3C, an end of an outer circumferential face of the take-up bobbin 31 is provided with a circumferential groove 37. The take-up bobbin 31 is provided with a guide cord (guide string member) 39. Formed at a front end of the guide cord 39 is a loop 39a that shrinks when tension acts on the guide cord 39.

As illustrated in FIG. 1, the inside of the second bobbin chamber 33 contains a second bobbin support member 41 to detachably and rotatably support the take-up bobbin 31 so that the take-up bobbin 31 may rotate around an axial center (of the take-up bobbin 31). At a proper position in the second bobbin chamber 33, a second motor 43 is arranged to rotate the take-up bobbin 31 around the axial center thereof. Also in the second bobbin chamber 33, a plurality of lower guide rollers 45 are rotatably arranged to guide the reinforcement fiber F toward the take-up bobbin 31.

In the second bobbin chamber 33 adjacent to a side of the lower guide rollers 45, a plurality of support members (only one illustrated), i.e., support bars 47 are arranged to support the loop 39a of the guide cord 39. Under the support bars 47 in the second bobbin chamber 33, a weight receiver 51 is arranged to receive a weight 49 (refer to FIG. 2A) attached to a front end of the reinforcement fiber F wound around the feed bobbin 9. Instead of the plurality of support bars 47, a U-shaped support member (not illustrated) may be employed.

Between the furnace body 3 and the second bobbin chamber 33, a lower communication sleeve 53 is arranged to communicate with them. A lower end of the lower communication sleeve 53 communicates with the inside of the second bobbin chamber 33 and an upper end of the lower communication sleeve 53 communicates with the inside of the furnace body 3. Namely, the lower communication sleeve 53 has a second communication path 55 that makes the inside of the second bobbin chamber 33 and the inside of the furnace body 3 communicate with each other. A cross-sectional part of the second communication path 55 is a second opening to make the inside of the second bobbin chamber 33 and the inside of the furnace body 3 communicate with each other.

In the middle of the lower communication sleeve 53 (between the furnace body 3 and the second bobbin chamber 33), a second shutter 57 is arranged to open and close the second communication path 55. The second shutter 57 is movable in the horizontal open-close direction through a second guide member (not illustrated). Under the furnace body 3, a second rodless cylinder 59 is arranged to move the second shutter 57 back and forth in the horizontal open-close direction. The second rodless cylinder 59 has a second needle 61 that is connected to the second shutter 57 and is movable in the horizontal open-close direction. The second shutter 57 is not limited to the one that moves back and forth in the horizontal open-close direction. It may be one that turns (swings) in the horizontal open-close direction.

Operation of the high-temperature processing furnace 1 having the above-mentioned structure will be explained.

The first rodless cylinder 27 is driven to move the first shutter 25 in a horizontal open direction (rightward in FIG. 1) so that the first shutter 25 opens the first communication path 23 and the inside of the first bobbin chamber 11 and the inside of the furnace body 3 communicate with each other. The second rodless cylinder 59 is driven to move the second shutter 57 in the horizontal open direction so that the second shutter 57 opens the second communication path 55 and the inside of the second bobbin chamber 33 and the inside of the furnace body 3 communicate with each other. The vacuum generators 5, 13, and 35 are driven to vacuum the inside of the furnace body 3, the inside of the first bobbin chamber 11, and the inside of the second bobbin chamber 33. The radiant heater 7 is driven to increase the internal temperature of the furnace body 3 to a predetermined processing temperature (for carrying out a high-temperature process). The first motor 17 and second motor 43 are driven to rotate the feed bobbin 9 and take-up bobbin 31 around their respective axial centers in synchronization with each other. As a result, the feed bobbin 9 feeds the reinforcement fiber F, the furnace body 3 carries out the high-temperature process on the reinforcement fiber F in a vacuum atmosphere, and the take-up bobbin 31 takes up the high-temperature-processed reinforcement fiber F around the outer circumferential face of the take-up bobbin 31.

At a proper position inside the lower communication sleeve 53 (second communication path 55), a funnel-like guide member (not illustrated) may be arranged to guide the weight 49 in the up-down direction. Under the weight receiver 51 in the second bobbin chamber 33, weight suction piping (not illustrated) connected to the vacuum generator 35 may be arranged to draw the weight 49 toward the weight receiver 51.

A reinforcement fiber joining method (reinforcement fiber connecting method) according to an embodiment of the present invention will be explained.

The reinforcement fiber joining method according to the present embodiment is executed in the middle of the carried out by the high-temperature processing furnace 1 in a vacuum atmosphere and joins (connects) a reinforcement fiber F wound around a feed bobbin 9 to the guide cord 39 attached to an empty take-up bobbin 31. The method includes a feed bobbin setting process, a first bobbin chamber connecting process, a take-up bobbin setting process, a second bobbin chamber connecting process, a weight passing process, a loop joining process, and a weight engaging process. These processes of the reinforcement fiber joining method according to the present embodiment will be explained in detail.

(i) Feed Bobbin Setting Process

The first rodless cylinder 27 is driven to move the first shutter 25 in a horizontal close direction (leftward in FIG. 1) so that the first shutter 25 closes the first communication path 23 as indicated with a virtual line in FIG. 1, the inside of the first bobbin chamber 11 and the inside of the furnace body 3 are blocked from each other to form a closed space in the first bobbin chamber 11, and the first bobbin chamber 11 is opened to the atmosphere, i.e., atmospheric pressure. An emptied feed bobbin 9 is detached from the first bobbin support member 15 and a feed bobbin 9 around which a reinforcement fiber F is wound is installed on the first bobbin support member 15. Namely, the feed bobbin 9 with the reinforcement fiber F is set in the first bobbin chamber 11.

(ii) First Bobbin Chamber Connecting Process

After the completion of the feed bobbin setting process, the vacuum generator 13 is driven for vacuuming the inside of the first bobbin chamber 11. The first rodless cylinder 27 is driven to move the first shutter 25 in the horizontal open direction (rightward in FIG. 1) so that the first shutter 25 opens the first communication path 23 as indicated with a solid line in FIG. 1 and the inside of the first bobbin chamber 11 and the inside of the furnace body 3 communicate with each other.

(iii) Take-Up Bobbin Setting Process

The second rodless cylinder 59 is driven, to move the second shutter 57 in the horizontal close direction (leftward in FIG. 1) so that the second shutter 57 closes the second communication path 55 and the inside of the second bobbin chamber 33 and the inside of the furnace body 3 are blocked from each other.

A take-up bobbin 31 around which a high-temperature-processed reinforcement fiber F is wound is detached from the second bobbin support member 41, a loop 39a of a guide cord 39 is placed on the support bars 47, and an empty take-up bobbin 31 is installed on the second bobbin support member 41. Namely, the empty take-up bobbin 31 is set in the second bobbin chamber 33.

(iv) Second Bobbin Chamber Connecting Process

After the completion of the take-up bobbin setting process, the vacuum generator 35 is driven for vacuuming the inside of the second bobbin chamber 33. The second rodless cylinder 59 is driven to move the second shutter 57 in the horizontal open direction (rightward in FIG. 1) so that the second shutter 57 opens the second communication path 55 as indicated with a slid line in FIG. 1 and the inside of the second bobbin chamber 33 and the inside of the furnace body 3 communicate with each other.

(v) Weight Passing Process

After the completion of the first bobbin chamber connecting process and second bobbin chamber connecting process, the first motor 17 is driven to rotate the feed bobbin 9 around its axial center to feed the weight 49 attached to the front end of the reinforcement fiber F into the second bobbin chamber 33 through the furnace body 3 as illustrated in FIGS. 1 and 2A. The weight 49 passes through the loop 39a of the guide cord 39 and rests on the weight receiver 51. When the first motor 17 is driven, it is preferable that a first reciprocation motor (not illustrated) is driven to reciprocate the feed bobbin 9 in its axial center direction.

(vi) Loop Joining Process

Figure 2B:
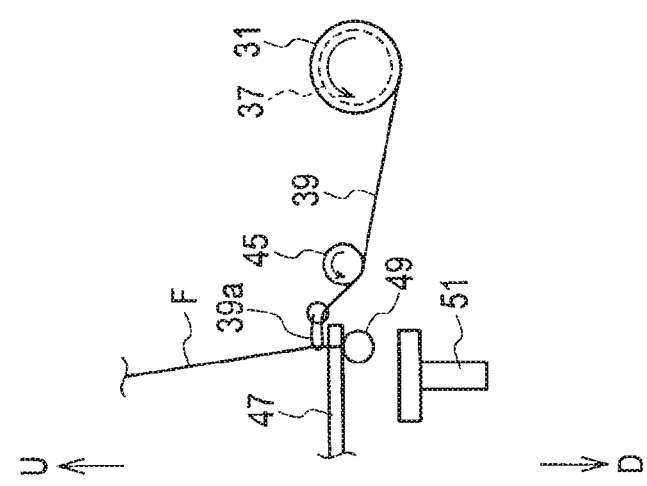
Figure 2C:
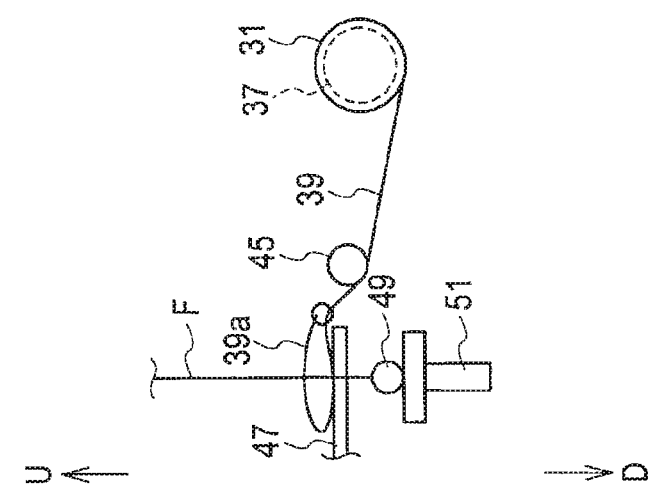

After the completion of the weight passing process, the second motor 43 is driven to rotate the take-up bobbin 31 around its axial center to draw the weight 49 toward the take-up bobbin 31 and shrink the loop 39a of the guide cord 39 as illustrated in FIGS. 1, 2B, and 2C. This results in joining the loop 39a of the guide cord 39 to the front end of the reinforcement fiber F.

(vii) Weight Engaging Process

After the completion of the loop joining process, the second motor 43 is driven to rotate the take-up bobbin 31 around its axial center to engage the weight 49 with the circumferential groove 37 of the take-up bobbin 31 as illustrated in FIGS. 1, 3A, and 3B. In synchronization with the rotation of the take-up bobbin 31, the first motor 17 is driven to rotate the feed bobbin 9 around its axial center. When the second motor 43 and first motor 17 are driven, it is preferable that a second reciprocation motor (not illustrated) is driven to reciprocate the take-up bobbin 31 in its axial center direction and the first reciprocation motor is driven to reciprocate the feed bobbin 9 in its axial center direction.

Through these processes, the reinforcement fiber F and the loop 39a of the guide cord 39 are joined (connected) to each other. Namely, the feed bobbin 9 and take-up bobbin 31 are joined to each other through the reinforcement fiber F.

The reinforcement fiber joining method according to the present embodiment may exclude the weight engaging process. In this case, after the completion of the loop joining process, the weight 49 is properly cut off from the front end of the reinforcement fiber F.

Functions and effects of the embodiments of the present invention will be explained.

The high-temperature processing furnace 1 has the first shutter 25 to open and close the first communication path 23 and the second shutter 57 to open and close the second communication path 55. In the joining operation of a reinforcement fiber F, there is no need of decreasing the internal temperature of the furnace body 3, vacuuming the inside of the furnace body 3, or increasing the internal temperature of the furnace body 3 when setting a feed bobbin 9 around which a reinforcement fiber F is wound in the first bobbin chamber 11 and an empty take-up bobbin 31 in the second bobbin chamber 33 (a function of the high-temperature processing furnace 1 according to the embodiment of the present invention).

The inside of the first bobbin chamber 11 and the inside of the furnace body 3 are made to communicate with each other and the inside of the second bobbin chamber 33 and the inside of the furnace body 3 are made to communicate with each other. Thereafter, the weight 49 is passed through the loop 39a of the guide cord 39 and the loop 39a of the guide cord 39 is shrunken and joined to a front end of the reinforcement fiber F. Accordingly, the reinforcement fiber F and the loop 39a of the guide cord 39 are automatically joined to each other. Namely, the feed bobbin 9 and take-up bobbin 31 are automatically connected to each other with the reinforcement fiber F (a function of the reinforcement fiber joining method according to the embodiment of the present invention).

In this way, the embodiments of the present invention conduct the joining operation of a reinforcement fiber F without decreasing the internal temperature of the furnace body 3, vacuuming the inside of the furnace body 3, or increasing the internal temperature of the furnace body 3 when setting the feed bobbin 9 around which a reinforcement fiber F is wound in the first bobbin chamber 11 and an empty take-up bobbin 31 in the second bobbin chamber 33. This results in greatly shortening a time needed for joining the reinforcement fiber F, i.e., a time needed for restarting the high-temperature process of the reinforcement fiber F and sufficiently improving the productivity (workability) of the high-temperature process of the reinforcement fiber F. In particular, the present invention is able to automatically connect the feed bobbin 9 and take-up bobbin 31 to each other with the reinforcement fiber F, to further improve the productivity of the high-temperature process of the reinforcement fiber F.

The present invention is not limited to the embodiments mentioned above but is achievable in various ways. For example, any one of the first and second motors and 43 may be omitted if tension necessary for the reinforcement fiber F is secured. The scope of rights of the present invention are not limited by these embodiments and modifications.

As mentioned above, the present invention is capable of conducting the joining operation of a reinforcement fiber without decreasing the internal temperature of the furnace body, vacuuming the inside of the furnace body, or increasing the internal temperature of the furnace body when setting a feed bobbin around which a reinforcement fiber is wound in the first bobbin chamber and an empty take-up bobbin in the second bobbin chamber. This results in greatly shortening a time needed for joining the reinforcement fiber, i.e., a time needed for restarting the high-temperature process of the reinforcement fiber and sufficiently improving the productivity (workability) of the high-temperature process of the reinforcement fiber.

The invention claimed is:

1. A reinforcement fiber joining method that employs a high-temperature processing furnace comprising a furnace body that is able to be set to vacuum and is adjustable in its internal temperature; a first bobbin chamber that is arranged on one heightwise side of the furnace body, is able to be set to vacuum, and sets therein a feed bobbin around which the reinforcement fiber is wound; a first bobbin support member that is set in the first bobbin chamber and detachably and rotatably supports the feed bobbin so that the feed bobbin is rotatable around its axial center; a first shutter that opens and closes a first communication path to connect the inside of the first bobbin chamber and the inside of the furnace body to each other; a second bobbin chamber that is arranged on the other heightwise side of the furnace body, is able to be set to vacuum, and sets therein a take-up bobbin to take up the reinforcement fiber after the high-temperature process; a second bobbin support member that is set in the second bobbin chamber and detachably and rotatably supports the take-up bobbin so that the take-up bobbin is rotatable around its axial center; a second shutter that opens and closes a second communication path to connect the inside of the second bobbin chamber and the inside of the furnace body to each other; and a support member that is arranged in the second bobbin chamber and supports a loop formed at a front end of a guide cord attached to the take-up bobbin, and the loop is shrinkable with tension acting on the guide cord, and in the high-temperature process of a reinforcement fiber carried out in a vacuum atmosphere, joins a reinforcement fiber wound around a feed bobbin to a guide cord attached to an empty take-up bobbin, the method comprising:

a feed bobbin setting process of driving the first shutter to close the first communication path so that the inside of the first bobbin chamber and the inside of the furnace body are blocked from each other, opening the inside of the first bobbin chamber to the atmosphere, detaching an emptied feed bobbin from the first bobbin support member, and attaching the feed bobbin around which the reinforcement fiber is wound to the first bobbin support member, thereby setting the reinforcement-fiber-wound feed bobbin in the first bobbin chamber;

a first bobbin chamber connecting process of, after the completion of the feed bobbin setting process, vacuuming the inside of the first bobbin chamber and driving the first shutter to open the first communication path so that the inside of the first bobbin chamber and the inside of the furnace body communicate with each other;

a take-up bobbin setting process of driving the second shutter to close the second communication path so that the inside of the second bobbin chamber and the inside of the furnace body are blocked from each other, opening the inside of the second bobbin chamber to the atmosphere, detaching a take-up bobbin around which a high-temperature-processed reinforcement fiber is wound from the second bobbin support member, supporting a loop of the guide cord on the support member, and attaching the empty take-up bobbin to the second bobbin support member, thereby setting the empty take-up bobbin in the second bobbin chamber;

a second bobbin chamber connecting process of, after the completion of the take-up bobbin setting process, vacuuming the inside of the second bobbin chamber and driving the second shutter to open the second communication path so that the inside of the second bobbin chamber and the inside of the furnace body communicate with each other;

a weight passing process of, after the completion of the first bobbin chamber connecting process and second bobbin chamber connecting process, rotating the feed bobbin around its axial center, so that a weight attached to a front end of the reinforcement fiber is fed into the second bobbin chamber through the inside of the furnace body and is passed through the loop of the guide cord; and a loop joining process of, after the completion of the weight passing process, turning the take-up bobbin around its axial center to draw the weight toward the take-up bobbin and shrink the loop of the guide cord, thereby joining the loop and the front end of the reinforcement fiber together.

2. The reinforcement fiber joining method according to claim 1, wherein the method further comprises a weight engaging process of, after the completion of the loop joining process, turning the take-up bobbin around its axial center and engaging the weight with a circumferential groove formed in an outer circumferential face of the take-up bobbin.

3. The reinforcement fiber joining method according to claim 1, wherein the reinforcement fiber is a ceramics fiber serving as a component of a ceramics-based composite material.

* * * * *